United States Patent
Shmyreva et al.

(10) Patent No.: US 9,994,785 B2
(45) Date of Patent: Jun. 12, 2018

(54) THERMALLY STABLE SELF-LUBRICATING COATINGS

(71) Applicant: Rolls-Royce Corporation, Indianapolis, IN (US)

(72) Inventors: Tetyana Shmyreva, Indianapolis, IN (US); Michael Cybulsky, Indianapolis, IN (US); Stephen Norman Hammond, Brownsburg, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 17 days.

(21) Appl. No.: 14/669,819

(22) Filed: Mar. 26, 2015

(65) Prior Publication Data

US 2015/0284653 A1    Oct. 8, 2015

Related U.S. Application Data

(60) Provisional application No. 61/974,220, filed on Apr. 2, 2014.

(51) Int. Cl.
*C10M 103/06* (2006.01)
*C10M 125/10* (2006.01)

(52) U.S. Cl.
CPC ........ *C10M 103/06* (2013.01); *C10M 125/10* (2013.01); *C10M 2201/0623* (2013.01);
(Continued)

(58) Field of Classification Search
CPC .............. C10M 103/06; C10M 125/10; C10M 2201/0653; C10M 2201/0623; C10N 2210/06; C10N 2230/06; C10N 2230/08; C10N 2250/14; C10N 2270/00; C10N 2280/00
See application file for complete search history.

(56) References Cited

U.S. PATENT DOCUMENTS 4,647,386 A   3/1987   Jamison
5,282,985 A   2/1994   Zabinski et al.
(Continued)

OTHER PUBLICATIONS

Examination Report from counterpart European Application No. 15161328.8, dated Aug. 1, 2016, 4 pp.
(Continued)

*Primary Examiner* — Cephia D Toomer
(74) *Attorney, Agent, or Firm* — Shumaker & Sieffert, P.A.

(57) ABSTRACT

In some examples, an article includes a substrate and a coating on the substrate. The coating includes a stabilized microstructure including Magnéli oxide phase including an oxide of at least one of W, Mo, Nb, Ta, or Re. In some examples, a technique may include forming a coating including a refractory metal on a surface of a substrate. The technique also may include heat treating the coating at a temperature between about 500° C. and about 700° C. to form a coating including a stabilized microstructure including Magnéli oxide phase. The stabilized microstructure including Magnéli oxide phase may include an oxide of at least one of W, Mo, Nb, Ta, or Re. In some examples, the coating including the stabilized microstructure including Magnéli oxide phase exhibits a coefficient of friction that is at least 25% less than the coefficient of friction exhibited by the as-deposited coating under similar conditions.

20 Claims, 4 Drawing Sheets

(52) U.S. Cl.
CPC . *C10M 2201/0653* (2013.01); *C10N 2210/06* (2013.01); *C10N 2230/06* (2013.01); *C10N 2230/08* (2013.01); *C10N 2250/14* (2013.01); *C10N 2270/00* (2013.01); *C10N 2280/00* (2013.01)

(56) References Cited

U.S. PATENT DOCUMENTS

| | | | |
|---|---|---|---|
| 5,470,494 | A | 11/1995 | Umeda |
| 5,843,533 | A | 12/1998 | Besmann et al. |
| 6,017,592 | A | 1/2000 | Woydt et al. |
| 7,445,763 | B2 | 11/2008 | Berger et al. |
| 7,543,992 | B2 | 6/2009 | Bruce et al. |
| 7,553,564 | B2 | 6/2009 | Gupta et al. |
| 7,921,972 | B2 | 4/2011 | D'Almeida et al. |
| 7,998,572 | B2 | 8/2011 | McGilvray et al. |
| 2009/0074522 | A1 | 3/2009 | Graham et al. |
| 2010/0087346 | A1 | 4/2010 | Giesler et al. |
| 2010/0310763 | A1 | 12/2010 | Oboodi et al. |
| 2011/0312860 | A1 | 12/2011 | Mathew et al. |
| 2012/0006785 | A1 | 1/2012 | Gorokhovsky et al. |
| 2015/0291800 | A1* | 10/2015 | Soebisch .............. C10M 103/04 428/336 |

OTHER PUBLICATIONS

Response to counterpart European Communication dated Oct. 12, 2015, from European Application No. 15161328.8, filed on Mar. 29, 2016, 10 pp.

Lugscheider, et al., "Tribological properties, phase generation and high temperature phase stability of tungsten-and vanadium-oxides deposited by reactive MSIP-PVD process for innovative lubrication applications," Surface and Coatings Technology, vol. 133-134, Nov. 2000, pp. 362-368.

Gassner, et a., "Magneli phase formation of PVD Mo-N and W-N coatings," Surface and Coatings Technology, vol. 201, No. 6, Aug. 9, 2006, pp. 3335-3341.

Bobzin, et al., "DC-MSIP/HPPMS (Cr, Al, V) N tand (Cr, Al,W) N thin films for high temperature friction reduction," Surface and Coatings Technology, vol. 205, No. 8-9, Jan. 25, 2011, pp. 2887-2892.

Extended European Search Report from counterpart European Application No. 15161328.8, dated Aug. 12, 2015, 5 pp.

Aouadi et al., "Adaptive Mo2N/MoS2/Ag Tribological Nanocomposite Coatings for Aerospace Applications," Tribology Letters, vol. 29, No. 2, Dec. 20, 2007, pp. 95-103.

Response to Examination Report dated Aug. 1, 2016, from counterpart European Application No. 15161328.8, filed Nov. 23, 2016, 7 pp.

Notice of Summons to Attend Oral Proceedings Pursuant to Rule 115(1) EPC, dated Sep. 19, 2017 for counterpart application number EP 15161328.8, 6 pages.

Written Submissions as filed Jan. 3, 2018 for the Oral Proceedings scheduled Feb. 6, 2018 for counterpart application number EP 151613288, 37 pages.

Notice of Intent to Grant and Text Intended to Grant from counterpart European Application No. 15161328.8, dated Mar. 20, 2018, 22 pp.

* cited by examiner

THERMALLY STABLE SELF-LUBRICATING COATINGS

This application claims the benefit of U.S. Provisional Patent Application No. 61/974,220, filed Apr. 2, 2014, titled, "THERMALLY STABLE SELF-LUBRICATING COATINGS." The entire content of U.S. Provisional Patent Application No. 61/974,220 is incorporated herein by reference.

TECHNICAL FIELD

The disclosure relates to self-lubricating coatings.

BACKGROUND

Lubricants are used to reduce friction and associated wear where two components contact each other. In some examples, liquid lubricants may be used. However, in some implementations, use temperatures may result in degradation of the liquid lubricant, so a dry film coating may be used as a lubricant.

In some examples, dry film coatings may include constituents that result in a chemical change in the coating as the temperature of the coating changes. This may result in the coating displaying lubricating properties over a range of temperatures. However, because the lubricating properties are based on the chemical changes in the coating, the lubricating properties may not be stable over multiple thermal cycles (e.g., from low temperature to a high temperature and back to a low temperature).

SUMMARY

The disclosure describes self-lubricating coatings whose lubricating properties are substantially stable under thermal cycling. For example, the coefficient of friction of the coating may be substantially stable over multiple thermal cycles. As used herein, substantially stable under thermal cycling means that the coefficient of friction does not appreciably change during thermal cycling over a temperature range from at least about 0° C. to about 700° C. In some examples, the self-lubricating coating may include a stabilized microstructure including Magnéli oxide phase. A Magnéli oxide phase has a metal-to-oxygen ratio of $Me_nO_{n-1}$ and/or $Me_nO_{n+1}$, where Me is the metal and O is oxygen. In some examples, the metal in the Magnéli oxide phase includes an oxide of a refractory metal such as W, Mo, Nb, Ta, or Re. The coating additionally may include at least one of N, P, S, or O. In some examples, the self-lubricating coating may further include at least one transition metal, such as Ti, V, Cr, Zr, Ru, Rb, Hf, Y, Mn, Fe, Co, Ni, Ag, Au, or Pt.

The stabilized microstructure including Magnéli oxide phase may be formed by heat treating and/or thermomechanically treating a coating including the at least one refractory metal and any other coating constituents. In some examples, the coating is heat-treated, the heat treatment may be performed at a temperature below about 800° C., e.g., below about 700° C. For example, the heat treatment may be performed at a temperature between about 500° C. and about 550° C. Heat treating and/or thermomechanically treating the coating may form stabilized microstructure including Magnéli oxide phase in the coating, and may reduce the coefficient of friction of the coating compared to the as-deposited coating. In some examples, heat treating and/or thermomechanically treating the coating and forming the stabilized microstructure including Magnéli oxide phase may reduce the coefficient of friction by at least about 25% compared to the as-deposited coating.

By forming the stabilized microstructure including Magnéli oxide phase, the coefficient of friction may be substantially stable over multiple thermal cycles within a range. In some examples, the range may be about 0° C. to about 700° C. Because of the substantial stability of the coefficient of friction, the coating including the stabilized microstructure including Magnéli oxide phase may be used as a dry film lubricant coating in applications where the components undergo thermal cycling during use, such has high temperature mechanical systems.

In one example, the disclosure describes an article including a substrate and a coating on the substrate. The coating includes a stabilized microstructure including Magnéli oxide phase including an oxide of at least one of W, Mo, Nb, Ta, or Re.

In another example, the disclosure describes a system including a first article and a second article. In accordance with this example, the first article includes a substrate and a coating on the substrate. The coating includes a stabilized microstructure including Magnéli oxide phase and defines a first surface. In accordance with this example, the second article defines a second surface, and the first article and second article are positioned during use such that the first surface contacts the second surface.

In another example, the disclosure describes a method including forming a coating including a refractory metal on a surface of a substrate. The method also includes heat treating the coating at a temperature between about 500° C. and about 700° C. to form a coating including a stabilized microstructure including Magnéli oxide phase. The stabilized microstructure including Magnéli oxide phase may include an oxide of at least one of W, Mo, Nb, Ta, or Re. In some examples, the coating including the stabilized microstructure including Magnéli oxide phase exhibits a coefficient of friction that is at least 25% less than the coefficient of friction exhibited by the as-deposited coating under similar conditions.

The details of one or more examples are set forth in the accompanying drawings and the description below. Other features, objects, and advantages will be apparent from the description and drawings, and from the claims.

DETAILED DESCRIPTION

The disclosure describes self-lubricating coatings whose lubricating properties are substantially stable under thermal cycling. For example, the coefficient of friction of the coating may be substantially stable over multiple thermal cycles. As used herein, substantially stable under thermal cycling means that the coefficient of friction does not appreciably change during thermal cycling over a temperature range from at least about 0° C. to about 700° C. In some examples, the self-lubricating coating may include a stabilized microstructure including Magnéli oxide phase. A Magnéli oxide phase has a metal-to-oxygen ratio of $Me_nO_{n-1}$ and/or $Me_nO_{n+1}$, where Me is the metal and O is oxygen. In some examples, the metal in the Magnéli oxide phase includes a refractory metal such as W, Mo, Nb, Ta, or Re. The coating additionally may include at least one of N, P, S, or O. In some examples, the self-lubricating coating may further include at least one transition metal, such as Ti, V, Cr, Zr, Ru, Rb, Hf, Y, Mn, Fe, Co, Ni, Ag, Au, or Pt.

The stabilized microstructure including Magnéli oxide phase may be formed by heat treating a coating including the at least one refractory metal and any optional coating constituents. In some examples, the heat treatment may be performed at a temperature of below about 800° C., e.g. below about 700° C. For example, the heat treatment may be performed at a temperature between about 500° C. and about 550° C. Heat treating the coating may form stabilized microstructure including Magnéli oxide phase in the coating, and may reduce the coefficient of friction of the coating. In some examples, heat treating the coating and forming the stabilized microstructure including Magnéli oxide phase may reduce the coefficient of friction by at least about 25% compared to the as-deposited coating.

By forming the stabilized microstructure including Magnéli oxide phase, the coefficient of friction of the coating may be substantially stable over multiple thermal cycles within a range. In some examples, the range may be about 0° C. to about 700° C. Because of the substantial stability of the coefficient of friction, the coating including the stabilized microstructure including Magnéli oxide phase may be used as a dry film lubricant coating in applications where the components undergo thermal cycling during use, such has high temperature mechanical systems.

Figure 1:
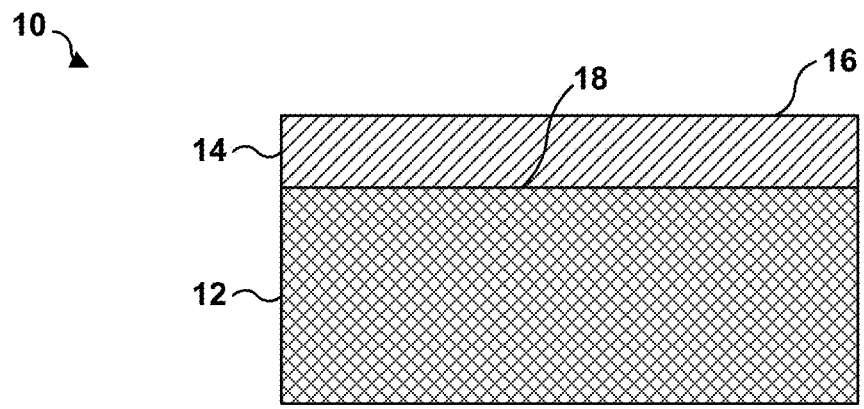
FIG. 1 is a conceptual and schematic diagram illustrating an example article including a substrate and a coating including a stabilized microstructure including Magnéli oxide phase on the substrate.

FIG. 1 is a conceptual and schematic diagram illustrating an example article 10 including a substrate 12 and a coating 14 including a stabilized microstructure including Magnéli oxide phase on the substrate 12. As described below with reference to FIG. 3, coating 14 may be formed by depositing a coating including at least one refractory metal (32) on surface 18 of substrate 12, followed by exposing the coating to a heat treatment and/or thermomechanical treatment to form the stabilized microstructure including Magnéli oxide phase.

Figure 2:
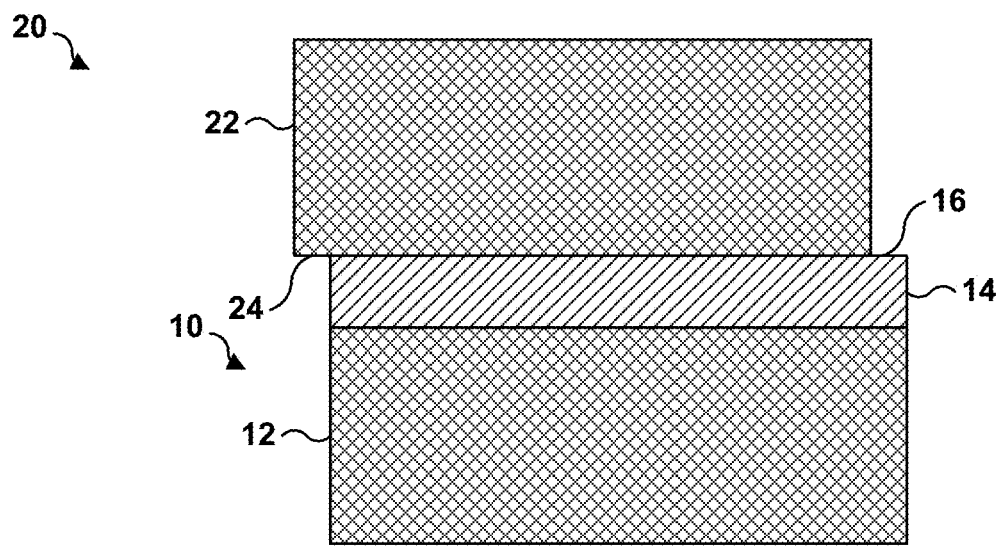
FIG. 2 is a conceptual and schematic diagram illustrating an example system including a first article and a second article, which includes a substrate and a coating including a stabilized microstructure including Magnéli oxide phase on the substrate.

Substrate 12 may be a substrate of an article 10 that, during use, is positioned to contact or intermittently contact a surface of another article. For example, FIG. 2 is a conceptual and schematic diagram illustrating an example system 20 including a first article 10 and a second article 22. First article 10 may be substantially the same as article 10 shown in FIG. 1, while second article 22 includes a surface 24 that may contact surface 16 of the coating 14 including the stabilized microstructure including Magnéli oxide phase. In this way, surface 16 of coating 14 forms a contact surface or bearing surface for article 10 with second article 22. In some examples, article 10 may be used in a high temperature mechanical system, and may be exposed to elevated temperatures during at least some portions of the use of article 10. For example, article 10 may be used in a gas turbine engine. In some examples, article 10 may be exposed to temperatures as high as about 700° C. during use. Substrate 12 may include a metal, an alloy, a superalloy, or the like. For example, substrate 12 may include steel, nickel, a Ni-, Co-, or Ti-based superalloy, or the like.

Coating 14 is on surface 18 of substrate 12. Coating 14 includes a stabilized microstructure including Magnéli phase oxide. A Magnéli oxide phase has a metal-to-oxygen ratio of $Me_nO_{n-1}$ and/or $Me_nO_{n+1}$, where Me is the metal and O is oxygen. A Magnéli oxide phase forms has an atomic structure similar to graphite, where there are multiple thin sheets of Magnéli oxide with low bond forces between the sheets. Because of this, the sheets may move relative to each other relatively easily, which may provide a relatively low coefficient of friction.

In some examples, the metal in the Magnéli oxide phase includes a refractory metal such as W, Mo, Nb, Ta, or Re. Coating 14 may include at least one of W, Mo, Nb, Ta, or Re, and may include two or more of W, Mo, Nb, Ta, or Re. Coating 14 additionally may include at least one non-metal, such as N, P, S, or O. In some examples, coating 14 may further include at least one transition metal, such as Ti, V, Cr, Zr, Ru, Rb, Hf, Y, Mn, Fe, Co, Ni, Ag, Au, or Pt.

At least some of the refractory metal in coating 14 may be oxidized to form the stabilized microstructure including Magnéli oxide phase. In some examples, at least some of the at least one transition metal, if present in coating 14, also may be oxidized to form the stabilized microstructure including Magnéli oxide phase. In some examples, coating 14 may include stabilized microstructure including Magnéli oxide phase dispersed within a matrix of other material, such as non-oxidized refractory metal, non-metal, and/or transition metal.

In some examples, after oxidation of coating 14 to form the stabilized microstructure including Magnéli oxide phase, coating 14 may comprise a chemical composition and phase composition that is substantially unchanging under changes in temperature. For example, after stabilization (oxidation), the amount of stabilized microstructure including Magnéli oxide phase and the composition of the Magnéli oxide phase and the other phases present in coating 14 may not appreciably change under changes in temperature.

In some examples, coating 14 may be relatively thin. For example, coating 14 may define a thickness, measured in the direction substantially normal to surface 18, on the order of several micrometers. In some examples, coating 14 may define a thickness, measured in the direction substantially normal to surface 18, of less than about 25.4 micrometers (less than about 0.001 inch).

Figure 3:
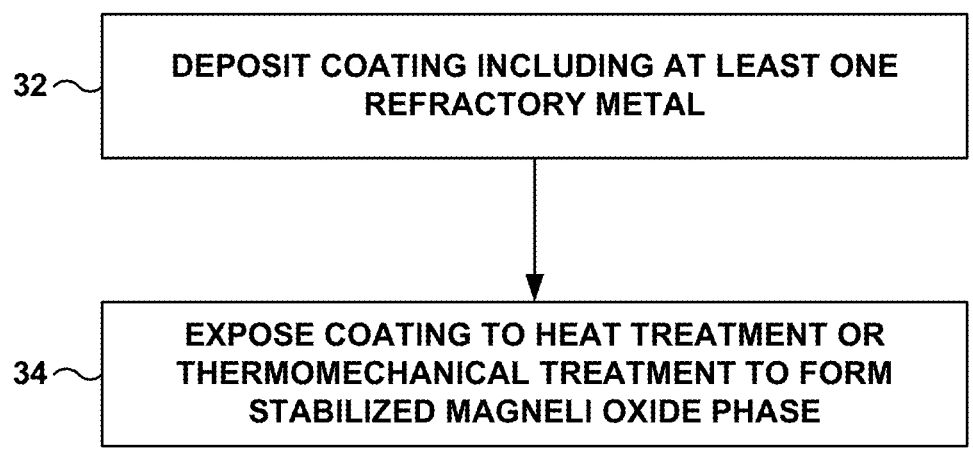
FIG. 3 is a flow diagram illustrating an example technique for forming a coating including a stabilized microstructure including Magnéli oxide phase on a substrate.

FIG. 3 is a flow diagram illustrating an example technique for forming a coating including a stabilized microstructure including Magnéli oxide phase on a substrate. The technique of FIG. 3 will be described with concurrent reference to article 10 of FIG. 1 for purposes of illustration only.

The technique of FIG. 3 includes depositing a coating including at least one refractory metal (32). In some examples, the as-deposited coating may include a metastable structure, such as an amorphous structure or a nanocrystalline structure. A metastable structure in the as-deposited coating may facilitate transformation of at least some of the as-deposited coating form Magnéli oxide phase by oxidation. For example, the metastable structure may allow formation of the stabilized microstructure including Magnéli oxide phase by heating to temperatures below about 800° C. (such as below about 700° C. or between about 500° C. and about 550° C.), rather than the temperature greater than 1000° C. used to convert coarse crystalline structures to Magnéli oxide phase.

As described above, in addition to the at least one refractory metal, the as-deposited coating additionally may include at least one non-metal, such as N, S, P, or O; at least one transition metal, such as Ti, V, Cr, Zr, Ru, Rb, Hf, Y, Mn, Fe, Co, Ni, Ag, Au, or Pt; or both. In some examples, the as-deposited coating may include tungsten (IV) sulfide ($WS_2$).

The as-deposited coating may be deposited using, for example, physical vapor deposition (PVD), sputtering, evaporation, cathodic arc deposition, chemical vapor deposition, painting, slurry coating, or paste application of nanopowders.

After the coating has been deposited (32), the coating may be exposed to a heat treatment and/or thermomechanical treatment to form the stabilized microstructure including Magnéli oxide phase (34). The heat treatment and/or thermomechanical treatment may oxidize at least some of the at least one refractory oxide in the as-deposited coating to form Magnéli oxide phase. Additionally, if at least one transition metal is present in the as-deposited coating, the heat treatment may oxidize at least some of the at least one transition metal to form Magnéli oxide phase. Magnéli oxide phase has a metal-to-oxygen ratio of $Me_nO_{n-1}$ and/or $Me_nO_{n+1}$, where Me is the metal and O is oxygen.

In examples in which the as-deposited coating is exposed to a heat treatment, the heat treatment may be performed at a temperature of less than about 800° C. As described above, the amorphous structure or a nanocrystalline structure may more readily convert into stabilized microstructure including Magnéli oxide phase than a bulk crystalline structure. Thus, the temperatures used to convert the at least one refractory metal into stabilized microstructure including Magnéli oxide phase may be lower than would be used if the at least one refractory metal were deposited with a bulk crystalline microstructure. In some examples, the heat treatment to form the stabilized microstructure including Magnéli oxide phase may be performed at a temperature of less than about 700° C., such as between about 500° C. and about 700° C., or between about 500° C. and about 550° C.

EXAMPLES

Comparative Example

Figure 4:
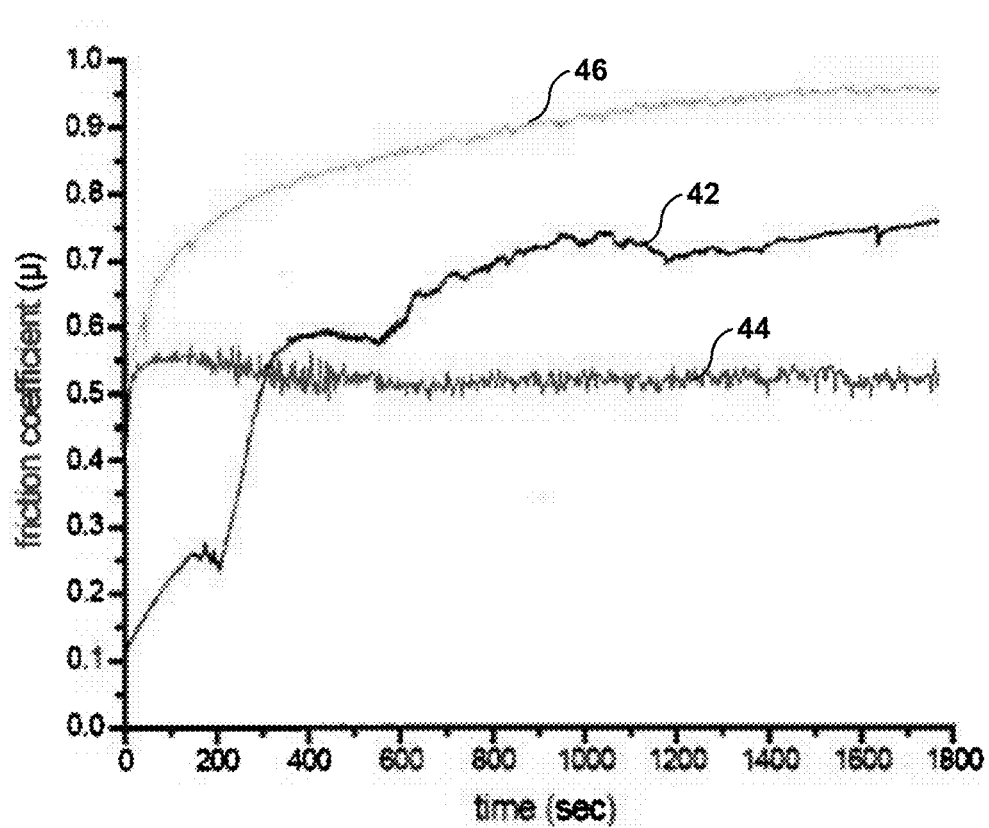
FIG. 4 is a diagram illustrating a coefficient of friction as a function of time for an example coating when tested at room temperature, an elevated temperature, and again at room temperature.

A coating consisting essentially of $WS_2$ was formed on a substrate using physical vapor deposition (PVD). The coefficient of friction of the coating was evaluated using pin-on-disk testing against a silicon nitride pin. FIG. 4 is a diagram illustrating the coefficient of friction as a function of time for the $WS_2$ coating. Curve 42 illustrates the coefficient of friction during a first test at room temperature (about 25° C.). As shown by curve 42, the coefficient of friction was initially low, increased abruptly, than began to level off at about 0.7. Curve 44 illustrates the coefficient of friction for the sample during a second test at about 540° C. As shown by curve 44, the coefficient of friction was substantially the same for the duration of the test at about 540° C., at a value of about 0.5. The coefficient of friction for this sample was generally lower during the test at 540° C. than during the first test at room temperature. Curve 46 illustrates the coefficient of friction during a third test at room temperature (about 25° C.). As shown by curve 46, the coefficient of friction was initially about 0.5, increased, than began to level off at about 0.95. The coefficient of friction during the third test (second at room temperature) was greater than the coefficient of friction during the first test at room temperature, indicating that the coefficient of friction for the coating consisting essentially of $WS_2$ was not stable under thermal cycling.

Example

Figure 5:
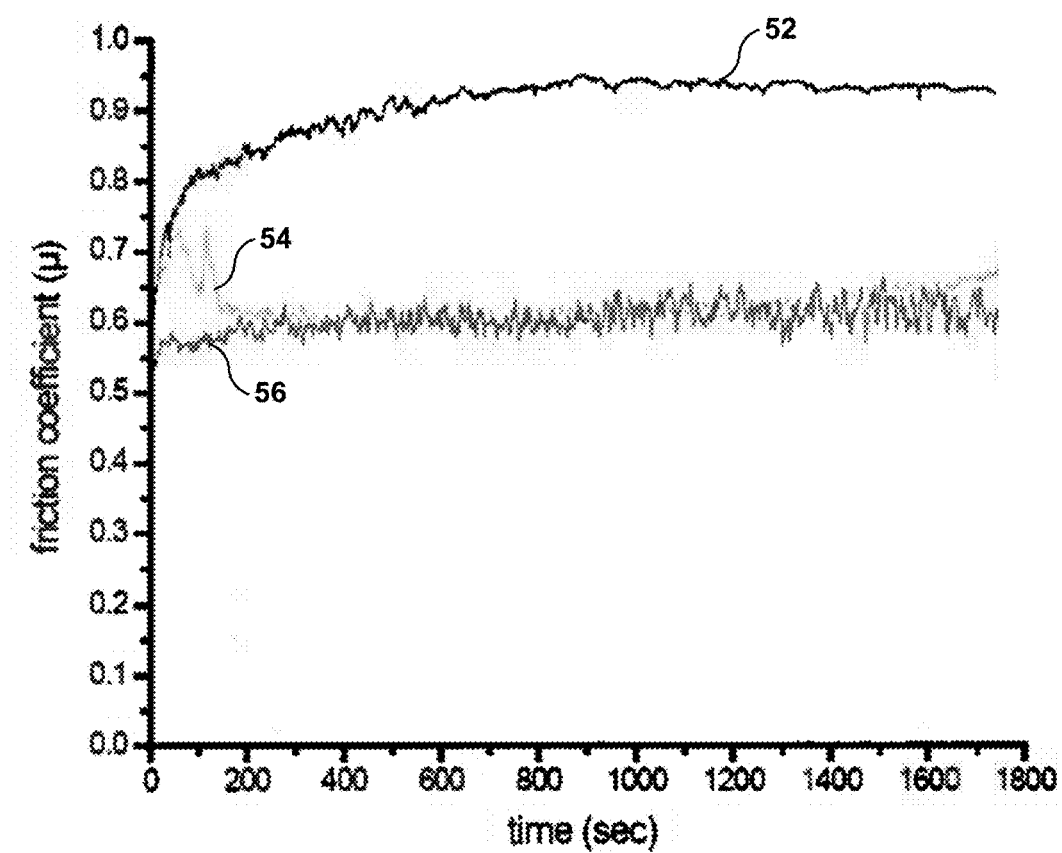
FIG. 5 is a diagram illustrating a coefficient of friction as a function of time for an example coating including a stabilized microstructure including Magnéli oxide phase when tested at room temperature, an elevated temperature, and again at room temperature.

A coating consisting essentially of $WS_2$ was formed on a substrate using physical vapor deposition (PVD). The coefficient of friction of the coating was evaluated using pin-on-disk testing against a silicon nitride pin. FIG. 5 is a diagram illustrating a coefficient of friction as a function of time for an example coating including a stabilized microstructure including Magnéli oxide phase when tested at room temperature, an elevated temperature, and again at room temperature. Curve 52 illustrates the coefficient of friction during a test at room temperature (about 25° C.). The friction test producing the curve 52 was performed after triblogical testing at 540° C. without a stabilization heat treatment. As shown by curve 52, the coefficient of friction was initially about 0.6 then increased to about 0.95 during the testing.

Curve 54 illustrates the coefficient of friction during a test at room temperature (about 25° C.) after a stabilization heat treatment. As shown by curve 54, the coefficient of friction was about 0.6 for the duration of the test at room temperature after the stabilization heat treatment, after an initial spike in the coefficient of friction. Additionally, the coefficient of friction after stabilization was about 30% lower than the coefficient of friction without stabilization and after heating to 540° C. (curve 52). Curve 56 illustrates the coefficient of friction during a test at about 540° C., after the stabilization heat treatment. As shown by curve 56, the coefficient of friction was substantially stable for the duration of the test, with a value of about 0.6. Additionally, the coefficient of friction at 540° C. was substantially the same as the coefficient of friction at room temperature, after the coating was stabilized. This indicates that the coefficient of friction was stable under thermal cycling.

Various examples have been described. These and other examples are within the scope of the following claims.

The invention claimed is:

1. An article comprising:
   a substrate; and
   a coating on the substrate, wherein the coating comprises a stabilized microstructure including a Magnéli oxide phase comprising an oxide of tungsten (W), wherein the coating has undergone heat treatment at a temperature between 500° C. and 700° C. to form the stabilized microstructure, wherein the coating forms an outer surface on the substrate.

2. The article of claim 1, wherein the Magnéli oxide phase comprises at least one metal oxide phase with a chemical formula of at least one of $W_nO_{n-1}$ and $W_nO_{n+1}$, wherein O is oxygen.

3. The article of claim 1, wherein the coating further comprises at least one non-metal selected from the group consisting of N, S, P, and combinations thereof.

4. The article of claim 1, wherein the coating further comprises at least one element selected from the group consisting of Ti, V, Cr, Zr, Ru, Rb, Hf, Y, Mn, Fe, Co, Ni, Pd, Ag, Au, Pt, and combinations thereof.

5. The article of claim 1, wherein the coating exhibits a substantially stable coefficient of friction over a range of temperatures between about 0° C. and about 700° C.

6. The article of claim 1, wherein the coating exhibits a substantially stable coefficient of friction over a plurality of thermal cycles that cycle between a temperature of about 25° C. and about 540° C.

7. The article of claim 1, wherein the coating including the stabilized microstructure including the Magnéli oxide phase is formed by heat treating a coating including tungsten (W) and at least one non-metal to a temperature between about 500° C. and about 700° C.

8. The article of claim 7, wherein the coating including the stabilized microstructure including the Magnéli oxide phase exhibits a coefficient of friction that is at least about 25% less than the as-deposited coating that has not undergone heat treatment at the temperature between 500° C. and 700° C.

9. A system comprising:
a first article comprising a substrate and a coating on the substrate, wherein the coating comprises a stabilized microstructure including a Magnéli oxide phase comprising an oxide of tungsten (W), wherein the coating has undergone heat treatment at a temperature between 500° C. and 700° C. to form the stabilized microstructure, and wherein the coating defines a first surface; and
a second article defining a second surface, wherein the first article and second article are positioned during use such that the first surface contacts the second surface.

10. The system of claim 9, wherein the Magnéli oxide phase comprises at least one metal oxide phase with a chemical formula of at least one of $W_nO_{n-1}$ and $W_nO_{n+i}$, wherein O is oxygen.

11. The system of claim 9, wherein the coating further comprises at least one non-metal selected from the group consisting of N, S, P, and combinations thereof.

12. The system of claim 9, wherein the coating further comprises at least one element selected from the group consisting of Ti, V, Cr, Zr, Ru, Rb, Hf, Y, Mn, Fe, Co, Ni, Pd, Ag, Au, Pt, and combinations thereof.

13. The system of claim 9, wherein the coating exhibits a substantially stable coefficient of friction over a range of temperatures between about 0° C. and about 700° C.

14. The system of claim 9, wherein the coating exhibits a substantially stable coefficient of friction over a plurality of thermal cycles that cycle between a temperature of about 25° C. and about 540° C.

15. A method comprising:
forming a coating comprising a refractory metal on a surface of a substrate; and
heat treating the coating at a temperature between about 500° C. and about 700° C. to form a coating comprising a stabilized microstructure including a Magnéli oxide phase comprising an oxide of tungsten (W), wherein the coating forms an outer surface on the substrate, and wherein the coating including the stabilized microstructure including the Magnéli oxide phase exhibits a coefficient of friction that is at least 25% less than the coefficient of friction exhibited by the as-deposited coating under similar conditions.

16. The method of claim 15, wherein heat treating the coating at the temperature between about 500° C. and about 700° C. comprises heat treating the coating at a temperature between about 500° C. and about 550° C.

17. The method of claim 15, wherein the coating further comprises at least one non-metal selected from the group consisting of N, S, P, and combinations thereof.

18. The method of claim 15, wherein the coating further comprises at least one element selected from the group consisting of Ti, V, Cr, Zr, Ru, Rb, Hf, Y, Mn, Fe, Co, Ni, Pd, Ag, Au, Pt, and combinations thereof.

19. The method of claim 15, wherein the coating exhibits a substantially stable coefficient of friction over a range of temperatures between about 0° C. and about 700° C.

20. The method of claim 15, further comprising exposing the article to a plurality of thermal cycles between about 25° C. and about 540° C., wherein the coating including the stabilized microstructure including the Magnéli oxide phase exhibits a substantially stable coefficient of friction over the plurality of thermal cycles.

\* \* \* \* \*